US006686803B1

United States Patent
Perrott et al.

(10) Patent No.: US 6,686,803 B1
(45) Date of Patent: Feb. 3, 2004

(54) INTEGRATED CIRCUIT INCORPORATING CIRCUITRY FOR DETERMINING WHICH OF AT LEAST TWO POSSIBLE FREQUENCIES IS PRESENT ON AN EXTERNALLY PROVIDED REFERENCE SIGNAL AND METHOD THEREFOR

(75) Inventors: Michael H. Perrott, Cambridge, MA (US); Jerrell P. Hein, Driftwood, TX (US); Rex T. Baird, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 177 days.

(21) Appl. No.: 09/902,543

(22) Filed: Jul. 10, 2001

Related U.S. Application Data
(60) Provisional application No. 60/217,207, filed on Jul. 10, 2000, and provisional application No. 60/217,208, filed on Jul. 10, 2000.

(51) Int. Cl.[7] .............................................. H03L 7/089

(52) U.S. Cl. ...................... 331/10; 331/107; 331/173; 331/117 R

(58) Field of Search ............................ 331/10, 117 R; 330/107; 333/173

(56) References Cited

U.S. PATENT DOCUMENTS

| | | | | |
|---|---|---|---|---|
| 3,684,976 A | * | 8/1972 | Terreault ...................... | 331/10 |
| 4,322,697 A | * | 3/1982 | Carbrey ....................... | 333/173 |
| 4,349,916 A | * | 9/1982 | Roeder ........................ | 375/349 |
| 4,728,906 A | * | 3/1988 | Turl et al. .................... | 331/10 |
| 5,039,955 A | * | 8/1991 | Motte .......................... | 331/10 |
| 5,138,281 A | * | 8/1992 | Boudewijns ................ | 331/10 |
| 5,731,737 A | * | 3/1998 | Cranford et al. ............ | 330/107 |
| 6,038,181 A | | 3/2000 | Braceras et al. | |
| 6,137,372 A | * | 10/2000 | Welland ................... | 331/117 R |
| 6,356,156 B2 | * | 3/2002 | Wesolowski ................ | 331/10 |
| 6,424,229 B1 | * | 7/2002 | Justice et al. ................ | 331/10 |

OTHER PUBLICATIONS

Andersson, L. I. et al, "Silicon Bipolar Chipset for SONET/SDH 10 Gb/s Fiber–Optic Communication Links," IEEE Journal of Solid–State Circuits, vol. 30, No. 3, Mar. 1995, pp. 210–218.

Belot, D. et al., "A 3.3–V Power Adaptive 1244/622/155 Mbit/s Transceiver for ATM, SONET/SDH," IEEE Journal of Solid–State Circuits, vol. 33, No. 7, Jul. 1998, pp. 1047–1058.

Gray, C. T. et al., "A Sampling Technique and Its CMOS Implementation with 1 Gb/s Bandwidth and 25 ps Resolution," IEEE Journal of Solid–State Circuits, vol. 29, No. 3, Mar. 1994, pp. 340–349.

(List continued on next page.)

*Primary Examiner*—Michael Tokar
*Assistant Examiner*—Lam T. Mai
(74) *Attorney, Agent, or Firm*—Zagorin, O'Brien & Graham LLP

(57) ABSTRACT

An internal frequency reference, such as a VCO used in a PLL, having a free-running frequency fairly well controlled within a predictable range, is used as a rough frequency reference to determine, for an externally-provided frequency reference signal, which of a finite number of discrete frequencies is currently received. The VCO has a frequency range which varies less, as a percentage, than the ratio between possible reference frequency values. Consequently, the VCO is used as a frequency reference to measure the frequency reference signal. An internal signal is generated to indicate to remaining circuitry which of the possible reference frequencies is actually being provided, without requiring use of any dedicated input pins to receive a select signal. An integrated circuit device may be configured for different modes of operation as a function of which reference frequency is provided to the device. Moreover, if one of the available reference clock frequencies is chosen to correspond to an internal test mode, the device may be placed in a test mode without requiring any additional dedicated input pins for that purpose, either.

47 Claims, 4 Drawing Sheets

OTHER PUBLICATIONS

Guiterrez G. et al, "2.488 Gb/s Silicon Bipolar Clock and Data Recovery IC for SONET (OC–48)," IEEE 1998 Custom Integrated Circuits Conference, pp. 575–578.

Guiterrez, G. and Kong, S., "Unaided 2.5 Gb/s Silicon Bipolar Clock and Data Recovery IC," VIII–7, 1998 IEEE Radio Frequency Integrated Circuits Symposium, pp. 173–176.

Hu, T. H. and Gray, P. R., "A Monolithic 480 Mb/s Parallel AGC/Decision/Clock–Recovery Circuit in 1.2–$\mu$m CMOS," IEEE Journal of Solid–State Circuits, vol. 28, No. 12, Dec. 1993, pp. 1314–1320.

Kawai, K. et al., "A 557–mW, 2.5–Gbit/s SONET/SDH Regenerator–Section Terminating LSI Chip Using Low–Power Bipolar–LSI Design," IEEE Journal of Solid–State Circuits, vol. 34, No. 1, Jan. 1999, pp. 12–17.

Pottbacker, A. et al., "A Si Bipolar Phase and Frequency Detector IC for Clock Extraction up to 8 Gb/s," IEEE Journal of Solid–State Circuits, vol. 27, No. 12, Dec. 1992, pp. 1747–1751.

"ProSLIC™ Programmable CMOS SLIC/Codec with Ringing/Battery Voltage Generation," Silicon Laboratories datasheet Si3210, Rev. 0.4 Jan. 2000, pp. 1–104, and particularly pp. 35–36 and pp. 22–23.

Razavi, Behzad, "Design of Monolithic Phase–Locked Loops and Clock Recovery Circuits—A Tutorial," Monolithic Phase–Locked Loops and Clock Recovery Circuits—Theory and Design, ed. B. Razavi, IEEE Press, N.Y., 1996, pp. 1–39.

Walker, R. C. et al., "A 10Gb/s Si–Bipolar TX/RX Chipset for Computer Data Transmission," IEEE International Solid–State Circuits Conference, Session 19, Paper 19.1 Slide Supplement, 1998, pp. 19.1–1–19.1–11.

Walker, R. C. et al., "A 1.5 Gb/s Link Interface Chipset for Computer Data Transmission," IEEE Journal on Selected Areas in Communications, vol. 9, No. 5, Jun. 1991, pp. 698–703.

Weston, H. T. et al., "A Submicrometer NMOS Multiplexer–Demultiplexer Chip Set for 622.08–Mb/s SONET Applications," IEEE Journal of Solid–State Circuits, vol. 27, No. 7 Jul. 1992, pp. 1041–1049.

* cited by examiner

INTEGRATED CIRCUIT INCORPORATING CIRCUITRY FOR DETERMINING WHICH OF AT LEAST TWO POSSIBLE FREQUENCIES IS PRESENT ON AN EXTERNALLY PROVIDED REFERENCE SIGNAL AND METHOD THEREFOR

CROSS-REFERENCE TO RELATED APPLICATION(S)

This application claims the benefit of U.S. Provisional Application No. 60/217,207, filed Jul. 10, 2000, and U.S. Provisional Application No. 60/217,208, filed Jul. 10, 2000, which are both hereby incorporated by reference.

BACKGROUND OF THE INVENTION

1. Field of the Invention

The present invention relates to signal generation circuits utilizing an externally provided frequency reference signal, and particularly relates to phase locked loop circuits utilizing an externally provided reference clock.

2. Description of the Related Art

Many integrated circuits having a phase locked loop (PLL) utilize an externally provided reference clock to aid in frequency acquisition of the phase locked loop. Frequently the internal voltage controlled oscillator (VCO) within the PLL is divided down and compared to the externally provided reference clock using a frequency detector, thereby assisting the phase locked loop to "lock" at a frequency which is a multiple of the reference clock. In some cases the frequency of the reference clock may be chosen to be one of several possible frequencies, and the internal VCO operates at the same frequency, irrespective of which one of the reference clock frequencies is provided. In this case the divider which generates the divided-down VCO clock must change its divide value to properly generate a clock having a frequency nominally equal to the external reference clock. In other cases the VCO may always operate at a fixed multiple of the externally provided reference clock. Nonetheless, it may still be desirable to know which of the possible reference clock frequencies is being provided to the device so that, for example, certain characteristics of the phase locked loop may be optimized for the particular frequency of operation.

Traditionally, integrated circuit devices which may be operated with more than one reference clock frequency include one or more additional external input pins to communicate to the device which of the frequencies is being provided to the device. For example, if any of four different reference clock frequencies may be used, two additional input pins are traditionally provided to the device, and a binary code is conveyed on the pair of pins to identify which of the reference clock frequencies is presented to the device.

Unfortunately, integrated circuit pins are a valuable resource for many integrated circuit devices and allocating two of such pins for a reference clock select function may result in fewer pins available for other, more important functionality requirements, or worse, may simply not be available to allocate at all. Even if extra integrated circuit pins are available for a reference clock select function, the board design or other aspects of the system design are, in all likelihood, more complicated.

One particular application area in which the integrated circuit package size is critical is fiber optic transmit and receive electronics that recover timing and drive the optics for serial data communication applications. One example of such a circuit includes a clock and data recovery circuit, which may be housed within an optical module housing where space is very critical.

What is desired is an improved technique which allows such devices to receive a reference clock having a frequency equal to one of several possible reference frequencies without requiring the use of dedicated reference clock select input pins.

SUMMARY OF THE INVENTION

Many types of voltage controlled oscillators (VCOs) have fairly well controlled free-running frequencies. For example, an LC-tank oscillator may have a free-running frequency controlled to within plus or minus a few percent. Other types of VCOs may be calibrated during manufacture (e.g., laser trimming) to result in a free-running frequency which is fairly well controlled within a predictable range.

Such a VCO may be used as a rough frequency standard to measure the externally provided frequency reference signal to determine its value from a finite number of discrete possible frequencies if they are sufficiently different in frequency to allow them to be distinguished using the VCO as the frequency standard. If the VCO has a frequency range which varies less, as a percentage, than the ratio between possible reference frequency values, then the VCO may be used as a frequency reference to measure the frequency reference signal. An internal signal may consequently be generated to indicate to remaining circuitry which of the possible reference frequencies is actually being provided, without requiring use of any dedicated input pins to receive a select signal.

Such an integrated circuit device may be configured for different modes of operation as a function of which reference frequency is provided to the device. Moreover, if one of the available reference clock frequencies is chosen to correspond to an internal test mode, the device may be placed in a test mode without requiring any additional dedicated input signals for that purpose either.

In one embodiment of the present invention, an integrated circuit includes a signal generation circuit responsive to an externally provided frequency reference signal having a frequency substantially equal to any of at least two possible reference frequencies. The signal generation circuit is included for generating an output signal related to the frequency reference signal. A frequency detection circuit responsive to the externally provided frequency reference signal is also included for determining which of the at least two possible reference frequencies is present, and for generating a control signal accordingly.

In another embodiment of the present invention an integrated circuit includes a phase locked loop circuit having an input for receiving an externally provided reference clock signal having a frequency substantially equal to any of at least two possible reference frequencies, and for generating a VCO output signal having a frequency related to that of the reference clock signal. The integrated circuit includes a frequency detection circuit for determining, absent any additional externally provided signal to so indicate, which of the at least two possible reference clock frequencies is present, and for communicating an indication thereof to the phase locked loop circuit.

In certain embodiments at least one of the possible reference clock frequencies corresponds to a normal operating mode of the device, and at least one of the possible reference clock frequencies corresponds to a test mode of the device.

A method embodiment of the present invention is suitable for use in an integrated circuit which is responsive to an externally provided frequency reference signal having a frequency substantially equal to any of at least two possible reference frequencies, in which the integrated circuit requires a different internal configuration depending upon which reference frequency is provided. A method of eliminating at least one external pin otherwise required to convey to the integrated circuit an external signal for indicating which reference frequency is provided, includes the steps of: (1) generating on the integrated circuit an internal signal having a frequency within a predetermined range; (2) comparing the externally provided frequency reference signal to the internal signal, to determine which reference frequency is provided; (3) generating at least one control signal as a result of the comparing step to indicate which reference frequency is provided; and (4) configuring the integrated circuit in accordance with the at least one control signal.

In a system including an integrated circuit responsive to an externally provided frequency reference signal, the integrated circuit having at least two possible modes of operation, a method of communicating a selected mode of operation to the integrated circuit includes the steps of providing to the integrated circuit an external frequency reference signal with a frequency substantially equal to a first reference frequency to select a first mode of operation, and providing to the integrated circuit an external frequency reference signal with a frequency substantially equal to a second reference frequency to select a second mode of operation.

In certain embodiments the first mode of operation is a normal operating mode and the second mode of operation is a test mode. In other embodiments the first and second modes of operation are both normal operating modes.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
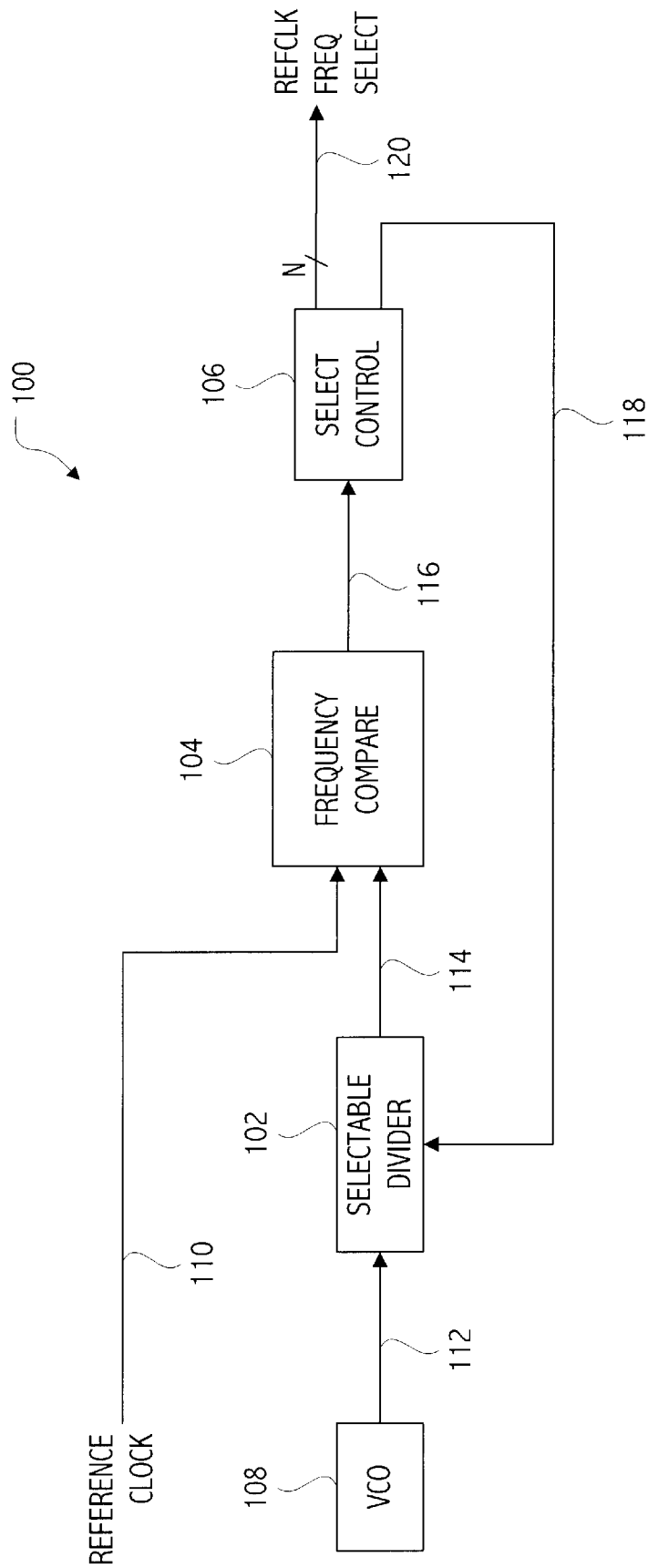
FIG. 1 is a block diagram of an embodiment of an auto-detect block in accordance with the present invention.

A block diagram is shown in FIG. 1 of a circuit block residing on an integrated circuit device that automatically detects which of at least two possible reference clock frequencies is being supplied to the integrated circuit device. The auto-detect block 100 includes a selectable divider 102 which receives, by way of node 112, the output clock from an internal voltage control oscillator 108. Alternatively, another source for an internal frequency reference could be used instead of a VCO. A frequency compare block 104 is used to compare the frequency of the reference clock signal conveyed on node 110 to the frequency of a second signal conveyed on node 114 which is either the VCO clock frequency or a divided-down version thereof. The output of the frequency compare block 104, conveyed on node 116, is communicated to a select control block 106 which provides an output signal (on an N-bit bus 120) to indicate which of the reference clock frequencies is detected, and also generates on node 118 one or more control signals to control the selectable divider block 102.

To appreciate the functionality of this circuit, assume the VCO 108 operates nominally at 200 MHz. Further assume that the reference clock supplied by way of node 110 may either be a 200 MHz clock, a 100 MHz clock, or a 50 MHz clock. The selectable divider block 102 produces on its output node 114 a clock rate which is either equal to 200, 100 or 50 MHz, depending upon the state of the control input (node 118) from the select control block 106. In one technique of finding the correct frequency, each of these three frequencies is sequentially conveyed on node 114 and is compared to the external reference clock by frequency compare block 104. An indication is provided by way of node 116 as to how well each frequency output of the selectable divider block 102 matches the external reference clock frequency. The select control block 106, which may be a relatively simple state machine, scans through all potential frequencies and generates the output signal (conveyed on node 120) in accordance with the frequency found to be the best match.

The selectable divider block 102 may be implemented in a variety of ways. For example, a string of simple dividers which together implement a rudimentary ripple counter may be implemented along with a multiplexer, controlled by the select input received on node 118, to choose which of the intermediate frequencies are routed to the output node 114. Alternatively, a more individualized divider circuit may be incorporated which is configured to produce various divider ratios when selected in accordance with the control input received on node 118.

If the frequency of the internal VCO is much higher than the highest potential reference clock frequency, an optional divider may be included between the VCO 108 and the selectable divider block 102 to generate a signal having a convenient frequency, such as the highest possible incoming frequency of the external reference clock. Each of the blocks described in FIG. 1 may be implemented in a variety of suitable ways.

Figure 2:
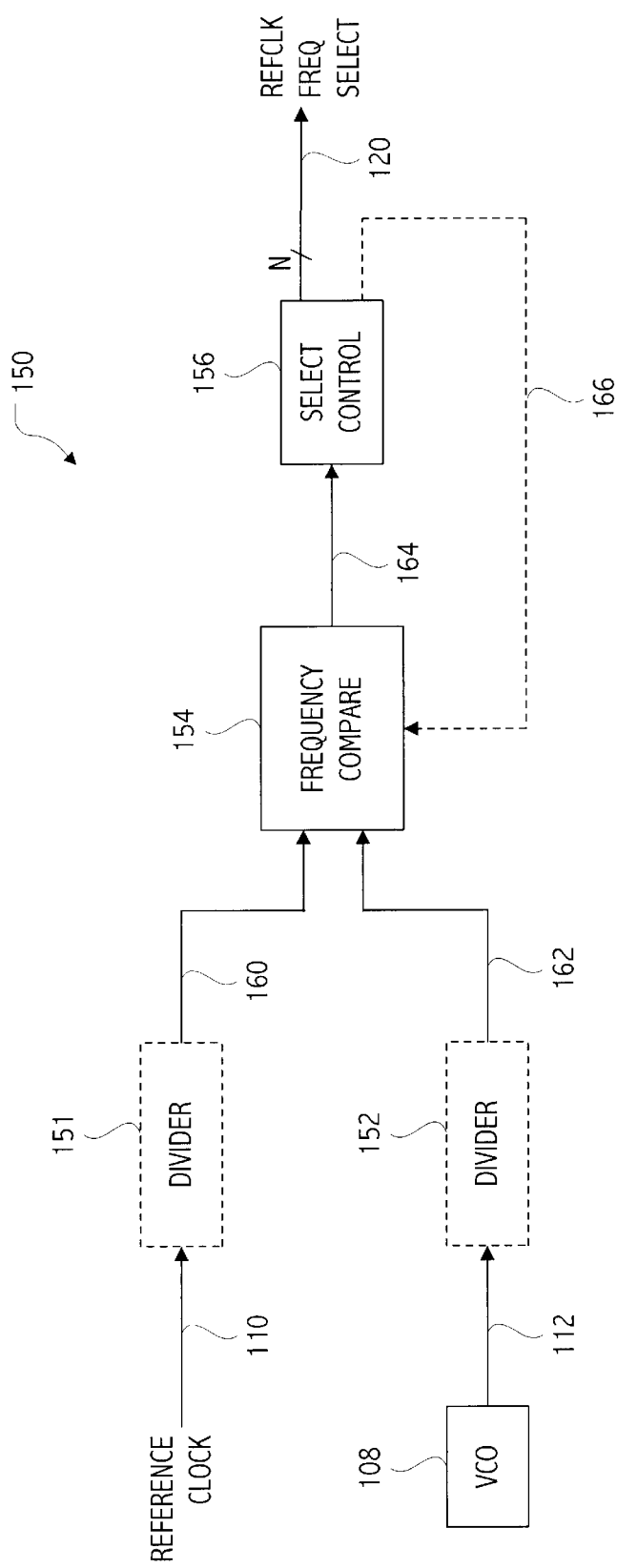
FIG. 2 is a conceptual block diagram of another embodiment of an auto-detect block in accordance with the present invention.

A conceptual block diagram is shown in FIG. 2 of another circuit block residing on an integrated circuit device that automatically detects which of at least two possible reference clock frequencies is being supplied to the integrated circuit device. The auto-detect block 150 includes an optional divider 151 that receives the reference clock signal conveyed on node 110 and generates an output signal on node 160 (either identical with the reference clock signal or preferably a divided-down version thereof). An optional divider 152 receives, by way of node 112, the output clock signal from the internal voltage control oscillator 108 and generates an output signal on node 162 (either identical with the VCO clock signal or preferably a divided-down version thereof). As before, another source for an internal frequency reference could be used instead of a VCO. A frequency compare block 154 is used to compare the frequency of the reference clock signal (or a divided-down version thereof) to the frequency of the VCO clock frequency (or a divided-down version thereof). The output of the frequency compare block 154, conveyed on node 164, is communicated to a select control block 156 which provides an output signal on node 120 (which may, if required, be an N-bit bus 120) to indicate which of the reference clock frequencies is detected. One or more optional control signals may also be generated on node 166 to control the frequency compare block 154. Alternatively, such a control signal may be generated entirely within the frequency compare block 154. The optional dividers 151, 152 are preferably utilized to lower the frequency of both the VCO clock and the reference clock, and consequently may simplify the implementation and lower the power consumption of the frequency compare block 154. Each of the blocks described in FIG. 2 may be implemented in a variety of suitable ways.

Figure 3:
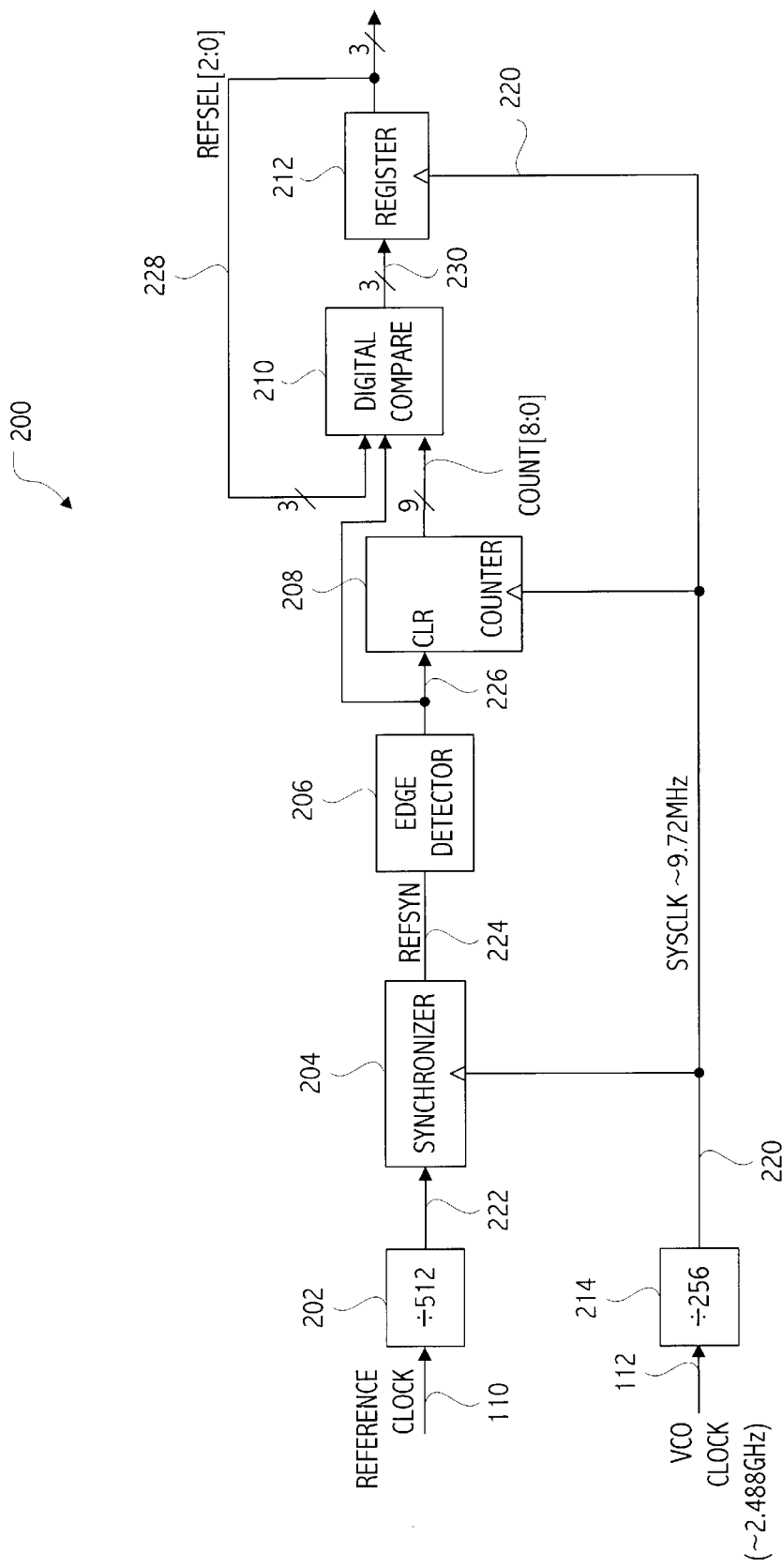
FIG. 3 is a block diagram of yet another embodiment of an auto-detect block in accordance with the present invention.

Referring now to FIG. 3, an embodiment is shown which is particularly suitable for use in a clock and data recovery circuit. In this exemplary embodiment an internal VCO (not shown) is configured to nominally operate at 2.488 GHz. The reference clock provided to the integrated circuit may have a frequency of 155.52 MHz, 77.76 MHz, 38.88 MHz, 19.44 MHz, 9.72 MHz or 4.86 MHz (or lower). The auto-detect block 200 includes a divide-by-256 block 214 which generates on its output node 220 a SYSCLK signal having a nominal frequency equal to 9.72 MHz. Also included is a divide-by-512 block 202 which receives the externally provided reference clock conveyed on node 110 and generates on its output node 222 a divided-down version thereof. Since the VCO clock runs so much faster than even the fastest potential externally provided reference clock frequency, the square wave generated on output node 222 is, for all possible reference clock frequencies, much slower than the SYSCLK signal generated on node 220. Since the externally provided reference clock is likely to be asynchronous to the VCO clock, particularly prior to initial lock of the loop, a synchronizer 204 is included to generate on its output node 224 a REFSYN signal substantially equal in frequency and duty cycle to its input signal, but which is synchronized to the SYSCLK signal. Such a synchronizer 204 may be implemented in any of a variety of well-known ways. One particularly suitable way utilizes two D-registers in series, both clocked by the SYSCLK signal, to reduce the likelihood of metastable operation influencing the timing of the output signal REFSYN. The REFSYN signal is therefore a synchronous signal with respect to the SYSCLK signal, although the edge placement of the REFSYN signal has an uncertainty of one cycle of the SYSCLK signal, as described below. Traditional synchronous design techniques may be utilized for the remainder of the circuitry.

The REFSYN signal conveyed on node 224 is next communicated to an edge detector 206 which generates on its output 226 a pulse upon detecting a high-to-low or low-to-high transition in the REFSYN signal. In other words, this pulse occurs once every half-period of the REFSYN signal. Counter 208 is provided to count the number of cycles of the SYSCLK signal which occur during each half period of the REFSYN signal. The output of the edge detector, node 226, is provided to counter 208 to clear the counter once per half period of the REFSYN signal. In this way, during each half period the counter 208 starts counting from zero and counts up to a value which indicates the number of SYSCLK cycles "counted" during the preceding half period of the REFSYN signal. The value of this counter is communicated, for this example, as a COUNT [8:0] signal using a nine-bit output bus. The digital compare block 210 compares the state of the COUNT signal, the state of the edge detector signal conveyed on node 226, and looks at the current state of the reference clock select signal conveyed on node 228 (denoted as the REFSEL[2:0] signal) to generate on its output bus 230 a updated value for the REFSEL signal which is clocked into a 3-bit register 212 by the SYSCLK signal.

Both divide blocks 202 and 214 may be conveniently implemented as a series connected group of simple registers configured as divide-by-two blocks forming a rudimentary ripple counter. No reset signal is required for these divider registers because even if they power up into arbitrary states, after a brief period of clocking all of the flip-flops will align themselves in a known state and implement correctly the appropriate divide-by factor for each of the two respective blocks. The edge detector 206 may be conveniently implemented in a variety of ways. One such particularly advantageous implementation utilizes an XOR gate. One input of the XOR gate is connected directly to the REFSYN signal conveyed on node 224, while the other input of the XOR gate is connected to a delayed version of the same REFSYN signal generated by a simple delay circuit. Such a configuration is well known in the art and generates a brief output pulse whose duration is equal to the delay through the delay circuit.

It can be appreciated from inspection of FIG. 3 that each half period of a synchronized signal, divided-down from an externally provided reference clock, is used to count the number of cycles of a divided-down VCO clock signal which occur during each half period. During each half period, a counter increments from zero up to a value indicative of how many SYSCLK signal clock cycles are counted, and which value is communicated as a multiple-bit signal on a parallel bus. By looking at the count value which is reached on this bus before it is reset, the frequency of the externally provided reference clock may be ascertained and appropriate internally provided select signals generated to indicate which of the potential reference clock frequencies is being provided to the device. If the nominal or free-running frequency of the VCO clock is controlled well enough to result in predictable ranges of count values as a function of which frequency the reference clock is operating at, then the maximum value of this count may be used to determine which of the discrete reference clock frequencies is provided.

Referring now to Table 1, a chart is shown which summarizes, for each of the six discrete possible reference clock frequencies, the resulting variations in the maximum value of the count value. In each of the six entries (i.e., rows) of the chart, the VCO frequency is assumed to vary within a range of −20% to +40% of the nominal value of 2.488 GHz. The third column of the chart specifies the corresponding SYSCLK period for both the low end and high end of the VCO operating range. As can be seen, the period ranges from 0.129 microseconds for a VCO operating at 20% below its nominal frequency (i.e., 2.0 GHz) to a period of 0.073 microseconds for a VCO operating at the upper end of its nominal operating range (i.e., 3.5 GHz). The fourth column of the chart sets forth the minimum length of the measurement interval with the VCO operating at 20% below its nominal frequency, and the maximum length of the measurement interval with the VCO operating at 40% above its nominal frequency. The measurement interval is defined by Equation 1.

$$t_{meas} = \frac{0.5}{\left(\frac{REFCLK}{512}\right)} \pm t_{SYSCLK} \quad \text{(Eq. 1)}$$

Recall that the measurement interval is one-half period of the REFSYN signal, which is a synchronized, divided-by- 512 derivative of the external reference clock signal REFCLK. The $\pm t_{SYSCLK}$ term accounts for the potential duty cycle error of 1 SYSCLK period caused by the synchronizer 204. The fifth column of Table 1 indicates the minimum and maximum value of the COUNT which corresponds to the measurement interval specified in the fourth column. Looking initially at the first line of the chart for a reference clock frequency of 155.52 MHz, and with a VCO operating 20% slower than its nominal operating frequency, the minimum COUNT value corresponds to 11 (the calculated value of 11.8 is truncated to 11 since a fraction of a count cannot be detected in this implementation). Similarly, for a fast VCO, the maximum COUNT value corresponds to 23.

the value of the count first reaches 24, at which point the reference clock is now known to be at one of the frequencies lower than the 155 MHz frequency. At this point it is not known which of the other frequencies the REFCLK is operating at, but it is concluded upon reaching the count of 24 that it cannot be operating at 155 MHz. In that case the value of the reference select signal REFSEL may be immediately decremented from 7 to 6, and the compare block 210 continues looking at the COUNT value. If the COUNT value reaches the next threshold value, in this case 48, the compare block determines that the reference clock cannot be operating at 77 MHz either, and immediately may update the register 212 containing the value of the REFSEL signal to a

TABLE 1

| REFCLK MHz | VCO freq. | $t_{SYSCLK}$ ($\mu$sec) | $t_{meas}$ ($\mu$sec) min max | COUNT min max | Comparison threshold | REFSEL [2:0] |
|---|---|---|---|---|---|---|
| 155.52 | −20% | 0.129 | 1.646 − 0.129 | 11.8 ≈ 11 | COUNT ≤ 23 | 7 |
|  | +40% | 0.073 | 1.646 + 0.073 | 23.4 ≈ 23 |  |  |
| 77.76 | −20% | 0.129 | 3.292 − 0.129 | 24.6 ≈ 24 | 24 ≤ COUNT ≤ 47 | 6 |
|  | +40% | 0.073 | 3.292 + 0.073 | 45.8 ≈ 45 |  |  |
| 38.88 | −20% | 0.129 | 6.584 − 0.129 | 50.2 ≈ 50 | 48 ≤ COUNT ≤ 95 | 5 |
|  | +40% | 0.073 | 6.584 + 0.073 | 90.6 ≈ 90 |  |  |
| 19.44 | −20% | 0.129 | 13.169 − 0.129 | 101.4 ≈ 101 | 96 ≤ COUNT ≤ 191 | 4 |
|  | +40% | 0.073 | 13.169 + 0.073 | 180.2 ≈ 180 |  |  |
| 9.72 | −20% | 0.129 | 26.34 − 0.129 | 203.8 ≈ 203 | 192 ≤ COUNT ≤ 383 | 3 |
|  | +40% | 0.073 | 26.34 + 0.073 | 359.4 ≈ 359 |  |  |
| 4.86 (or less) | −20% | 0.129 | 52.68 − 0.129 | 408.6 ≈ 408 | 384 ≤ COUNT | 2 |
|  | +40% | 0.073 | 52.68 + 0.073 | 717.8 ≈ 717 |  |  |

The sixth column of Table 1 indicates a comparison threshold for the COUNT value which may be used to ascertain which of the reference clock frequencies is measured. The final column indicates the value of the reference select signal REFSEL which is accordingly set when the COUNT value falls within the range specified in the sixth column. For example, again looking at the first entry of the table, (i.e., REFCLK=155 MHz), if the maximum COUNT value reached before being reset is less than or equal to 23, then the reference clock may be assumed to be equal to the 155.52 MHz frequency, and the REFSEL signal is set to 7. This maybe safely assumed even taking into account the assumed variations in VCO operating frequency. Looking at the second entry of the table, if the COUNT value reached before being reset falls within the range greater than or equal to 24, but less than or equal to 47, the REFCLK is assumed to be equal to 77.76 MHz, and the REFSEL signal is set to a value of 6.

The logic within the digital compare block 210 may be implemented in a wide variety of ways to perform the necessary function of ascertaining the highest count value reached before being reset. One potential method which might be employed would involve looking at the value of the counter just before it is reset and unilaterally setting the value of the reference select signal based upon what that maximum value was determined to be. One potential difficulty with this approach concerns the situation when no external reference clock is being provided to the device. In such a case the compare logic 210 would be waiting forever for a signal which never occurs and consequently the state of the reference select signal may either be undetermined or may be not optimal for a device having no reference signal applied thereto. Another approach assumes initially that the reference select signal is set to a value of 7 when the counter 208 initially starts incrementing. The compare block 210 waits until the first threshold is exceeded, in this case when value of 5. At some point, assuming a valid REFCLK signal is indeed being received by the device, the edge detector 206 will generate a pulse on node 226 which generates a synchronous clear input signal to the counter 208 which causes it to be reset to 0 upon the next transition of the SYSCLK signal. The REFSEL signal, having been gradually decremented as the value of the count grew, should be therefore already set properly for the particular reference clock frequency encountered. If no external reference clock is being provided, the edge detector never generates a pulse on node 226. However, the digital compare circuitry described above still reaches the correct REFSEL value of 2, indicating that REFCLK≦4.86 MHz.

Assume briefly that the reference select signal REFSEL reached 5 as a result of the first pass of counting, as described above. When the counter again starts incrementing, it will eventually reach the count of 24, as before. This time, however, the compare block 210 sees that the REFSEL signal is already set to a value which is less than 6, and therefore does not cause the value to change. When the next threshold value of 48 is reached, the reference select signal is already set to a value of 5 and the compare block 210 may be arranged to reinforce this value. Preferably, any such circuit within the auto detect block 200, and particularly the digital compare block 210 should be designed to tolerate unknown logic state conditions either as a result of system power-up or as a result of perturbations on power supply lines or arising from other noise sources.

During the initial measurement cycle, one particular advantage of incrementally updating the value of the reference select signal REFSEL as each succeeding count threshold is reached, rather than waiting for the pulse which clears the counter, arises because the REFSEL signal more quickly approaches its correct value, even during the initial counting period. If the value of the REFSEL signal is communicated immediately to other circuits within the device and which, as would be expected, is used to adjust various divide ratios, the internal clock rate of other circuits may more quickly be caused to increase as the reference clock is determined to be one of the lower potential external reference clock frequencies. This may speed up any self-test or calibration activities, and may speed up the acquisition of frequency lock in an internal PLL circuit.

Referring again to Table 1, the last entry indicates a reference clock frequency of 4.86 MHz. In a preferred embodiment, this frequency is not actually used. Instead, whenever the COUNT value reaches 384, the reference clock frequency is assumed to be 2.43 MHz rather than 4.86 MHz, the REFSEL signal is set to 2, and the remainder of the device is configured accordingly for a 2.43 MHz reference clock frequency.

It should be appreciated upon inspection of the embodiment shown in FIG. 3 that very few circuits operate at a frequency anywhere close to a high frequency. Most circuits, in fact, operate at a quite slow frequency. Moreover, almost no circuits operate at the reference clock frequency. This reduces the digital noise that might otherwise be communicated into a PLL that uses the reference clock frequency. Furthermore, traditional design techniques may be utilized to implement the various circuit blocks described herein. For example, the circuits "downstream" of the synchronizer 204, such as the edge detector 206, the counter 208, the register 212, and especially the digital compare block 210, are not particularly critical in performance, and are therefore particularly suitable for implementation using logic synthesis tools to achieve the functionality described.

Figure 4:
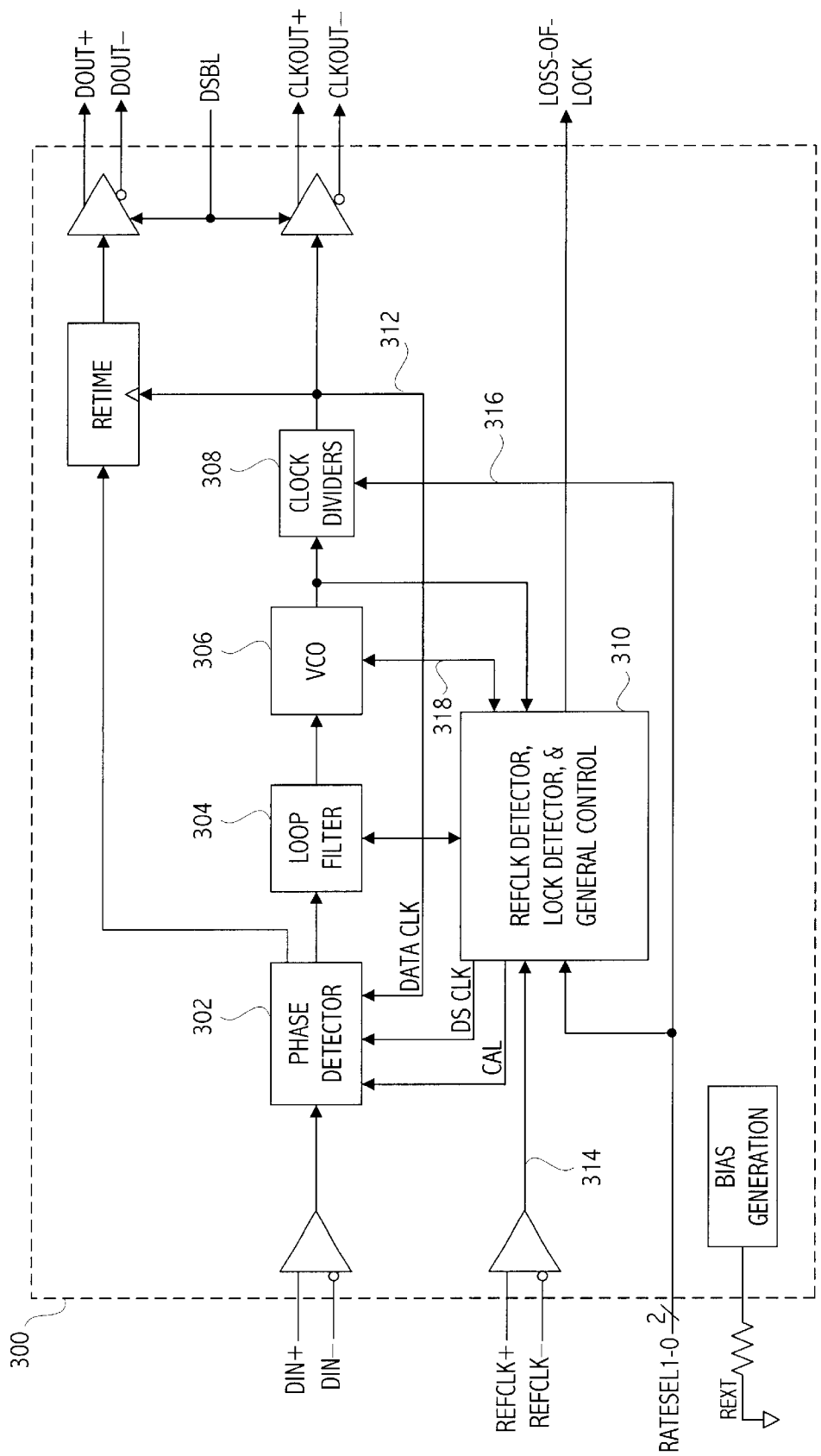
FIG. 4 is a block diagram of a clock and data recovery circuit incorporating the present invention, and for which the present invention is particularly advantageous.

Referring now to FIG. 4, a block diagram of an exemplary clock and data recovery circuit 300 is shown which advantageously incorporates the present invention. This exemplary clock and data recovery circuit 300 is preferably implemented as a single integrated circuit particularly well suited to operation with a SONET (Synchronous Optical Network) data stream. A differential input data signal is buffered and conveyed to a phase detector 302 along with a data rate clock signal conveyed on node 312. The phase error signal from the phase detector 302 is filtered by a loop filter 304 to generate a first control signal for a VCO 306. A clock divider block 308 selectively divides the VCO clock signal in accordance with an externally-provided rate select signal communicated on node 316 to generate the data rate clock signal on node 312. An eternally-provided reference clock signal REFCLK is buffered and conveyed on node 314 to a lock detector block 310, along with the rate select signal on node 316 and the data rate clock signal on node 312. The lock detector block 310 preferably generates a LOSS-OF-LOCK signal (LOL) if the frequency of the VCO 306 mismatches an exact multiple of the REFCLK frequency by more than a prescribed amount. Once the LOL signal is asserted, a calibration algorithm is preferably executed which applies a set of tuning and control signals for the phase detector 302, for the loop filter 304, and for the VCO 306 (on node 318) to aid in frequency acquisition of the data recovery PLL.

The VCO 306 is preferably an LC oscillator, although other types are also contemplated. Exemplary LC oscillators are described in U.S. Pat. No. 6,137,372 to Welland which is hereby incorporated by reference, and are further described in "Feedback System Incorporating Slow Digital Switching for Glitch-Free State Changes," by Rex T. Baird, et. al., U.S. Provisional Application No. 60/300,699, filed on Jun. 25, 2001, which application is hereby incorporated by reference. Other types of controlled oscillators, such as a current controlled oscillator with a suitable control signal, are also contemplated.

While the present invention is contemplated for use with a wide variety of different circuits and systems, preferred circuits useful for implementing a phase locked loop circuit, and particularly suited for a clock and data recovery application, are described in the following U.S. patent applications, each of which is being filed on Jul. 10, 2001, and each of which is hereby incorporated by reference: "Digital Phase Detector Circuit and Method Therefor," by Perrott, U.S. patent application Ser. No. 09/902,542; "Digitally-Synthesized Loop Filter Circuit Particularly Useful for a Phase Locked Loop," by Perrott, et al, U.S. patent application Ser. No. 09/902,541; and "Apparatus and Method for Decimating a Digital Input Signal," by Perrott, U.S. patent application Ser. No. 09/902,548.

An auto-detect block, such as the auto-detect block 200 described above, is preferably implemented within the lock detector block 310 to auto-detect which REFCLK frequency, of several possible frequencies, is received by the device, without requiring dedicated integrated circuit pins to so indicate. In this example, the circuit 300 configures the VCO 306 to operate at a nominal frequency of 2.488 GHz when receiving an externally-provided REFCLK frequency of either 155.52, 77.76, or 19.44 MHz. Of course, in operation the exact frequency of the VCO 306 adjusts depending on the incoming data signal. Depending upon which REFCLK frequency is detected, various logic gates and dividers are configured in the lock detector 310 to ensure that the VCO operates at a multiple of the REFCLK frequency necessary to generate a 2.488 GHz VCO clock rate. Once configured, the VCO clock frequency may be compared to the REFCLK frequency and verified to be nearly an exact multiple of the REFCLK frequency. If not, the system may then calibrate the VCO and loop filter and attempt to re-detect the REFCLK frequency.

Other potential REFCLK frequencies, such as 38.88, 9.72, and 2.43 MHz, are not available for use in a normal operating mode, but preferably instead correspond respectively to different test modes of operation (a REFCLK frequency of 4.86 MHz is not used, as described above). When a REFCLK frequency equal to one these three "normally unused" frequencies is auto-detected, the clock and data recovery circuit 300 preferably enters a corresponding one of three available test modes, all without requiring dedicated pins to convey one or more test mode enable signals which might otherwise be required.

As used herein, a "clock signal" is not necessarily a well-shaped square wave with abrupt transitions, as is commonly assumed in modest-speed digital circuits. Rather, a clock signal need only be a periodic signal (or a gated periodic signal). Consequently, sawtooth waveforms, "sloppy" square waveforms, sinusoidal waveforms, triangular waveforms, and any other periodic waveform may be used as a clock signal. An externally-provided frequency reference signal may be a signal entirely generated off-chip and conveyed as a identifiable signal to the integrated circuit. Alternatively, such an externally-provided frequency reference signal may be provided by a resonant circuit, such as a crystal, coupled to the integrated circuit even though a portion of any required "oscillator" circuitry may be contained on-chip.

Even though the block diagrams herein are described using the concept of circuit nodes connecting the blocks, it should be appreciated that, when required by various embodiments, such a "node" may actually represent a pair of nodes for conveying a differential signal, or may represent multiple separate wires (e.g., a bus) for carrying several related signals or a multi-bit digital word.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, any of a variety of circuits may be used to compare the reference frequency signal to an internal frequency source. In particular, a PLL with a particular lock range could be used to sequentially try to lock onto each of the possible reference frequencies. Such a circuit could try each divider setting until a lock indication is received. In some cases the bias level of a VCO control voltage may be used to indicate which frequency is "detected." Alternatively, a phase/frequency detector type circuit could be provided having an output which indicates whether the external reference signal is above or below the frequency of an internally generated signal. An accompanying state machine then searches each frequency until its frequency is "bounded" by two comparisons. A group of possible reference frequencies having frequencies other than which are related by a factor of two in frequency may be used provided the internal frequency reference is controlled to an acceptable degree to enable unambiguous determinations. In some embodiments utilizing a PLL, the VCO does not always operate at the same nominal frequency and various dividers in the PLL feedback path may or may not be configured as a function of which external reference frequency is provided. Moreover, the VCO need not operate at a frequency which is an integral multiple of the external reference frequency, but rather may operate, at times, with a multiple which is a ratio of integers. Accordingly, other embodiments, variations, and improvements not described herein are not necessarily excluded from the scope of the invention, which is defined by the following appended claims.

The foregoing details description has described only a few of the many possible implementations of the present invention. For this reason, this detailed description is intended by way of illustration, and not by way of limitations. It is only the following claims, including all equivalents, that are intended to define the scope of this invention.

What is claimed is:

1. An integrated circuit comprising:
   a signal generation circuit responsive to an externally provided frequency reference signal having a frequency substantially equal to any of at least two possible reference frequencies, said signal generation circuit for generating an output signal related to the frequency reference signal; and
   a frequency detection circuit responsive to the externally provided frequency reference signal, for determining which of the at least two possible reference frequencies is present, and for generating a control signal accordingly.

2. The integrated circuit as recited in claim 1 wherein the output signal comprises a periodic signal having a nominal frequency related to the externally provided frequency reference signal.

3. The integrated circuit as recited in claim 1 wherein the frequency detection circuit is configured to determine, absent any additional externally provided signal to so indicate, which of the at least two possible reference frequencies is present.

4. The integrated circuit as recited in claim 1 wherein the frequency reference signal is provided by an externally generated reference clock signal.

5. The integrated circuit as recited in claim 1 wherein the frequency reference signal is provided by a resonant circuit coupled to the integrated circuit.

6. The integrated circuit as recited in claim 1 wherein:
   when the reference frequency signal is provided with a frequency substantially equal to a first reference frequency, the signal generation circuit is configured to generate the output signal with a nominal frequency which is a first multiple of the reference frequency signal; and
   when the reference frequency signal is provided with a frequency substantially equal to a second reference frequency, the signal generation circuit is configured to generate the output signal with a nominal frequency which is a second multiple of the reference frequency signal.

7. The integrated circuit as recited in claim 6 wherein:
   the nominal frequency of the output signal, when generated as the first multiple of the first reference frequency, and when generated as the second multiple of the second reference frequency, is substantially identical.

8. The integrated circuit as recited in claim 6 wherein:
   the value of the first multiple comprises a first integer; and
   the value of the second multiple comprises a second integer different from the first integer.

9. The integrated circuit as recited in claim 6 wherein:
   the value of the first multiple comprises a first ratio of integers; and
   the value of the second multiple comprises a second ratio of integers different from the first ratio.

10. The integrated circuit as recited in claim 6 wherein:
    the value of the first multiple and the value of the second multiple are identical.

11. The integrated circuit as recited in claim 2 wherein the output signal comprises a VCO output clock signal.

12. An integrated circuit comprising:
    a signal generation circuit responsive to an externally provided frequency reference signal having a frequency substantially equal to any of a plurality of possible reference frequencies, said signal generation circuit for generating a periodic output signal having a nominal frequency that is a configurable multiple of the frequency of the externally provided frequency reference signal; and
    a frequency detection circuit for determining, absent any additional externally provided signal to so indicate, which of the plurality of possible reference frequencies is present, and for configuring the multiple for the periodic output signal accordingly.

13. The integrated circuit as recited in claim 12 wherein the frequency reference signal is provided by an externally generated reference clock signal.

14. The integrated circuit as recited in claim 12 wherein the frequency reference signal is provided by a resonant circuit coupled to the integrated circuit.

15. The integrated circuit as recited in claim 12 wherein:
    the multiple by which the nominal frequency of the output signal relates to the frequency of the externally provided reference frequency signal is identical for at least two of the possible reference frequencies of the externally provided frequency reference signal.

16. The integrated circuit as recited in claim 15 wherein:
    the multiple by which the nominal frequency of the output signal relates to the frequency of the externally provided reference frequency signal is different for at least two of the possible reference frequencies of the externally provided frequency reference signal.

17. The integrated circuit as recited in claim 16 wherein:
the nominal frequency of the output signal is substantially identical for at least two of the possible reference frequencies of the externally provided frequency reference signal.

18. The integrated circuit as recited in claim 15 wherein:
the multiple by which the nominal frequency of the output signal relates to the frequency of the externally provided reference frequency signal is different for each of the possible reference frequencies of the externally provided frequency reference signal; and
the nominal frequency of the output signal is substantially identical for each of the possible reference frequencies of the externally provided frequency reference signal.

19. The integrated circuit as recited in claim 12 wherein:
the multiple by which the nominal frequency of the output signal relates to the frequency of the externally provided reference frequency signal, for at least one of the possible reference frequencies of the externally provided frequency reference signal, comprises a ratio of integers.

20. The integrated circuit as recited in claim 12 wherein:
the multiple by which the nominal frequency of the output signal relates to the frequency of the externally provided reference frequency signal, for at least one of the possible reference frequencies of the externally provided frequency reference signal, comprises an integer.

21. An integrated circuit comprising:
a signal generation circuit responsive to an externally provided frequency reference signal having a frequency substantially equal to any of a plurality of possible reference frequencies, said signal generation circuit for generating a periodic output signal having a nominal frequency that is a configurable multiple of the frequency of the externally provided frequency reference signal; and
circuit means for determining, absent any additional externally provided signal to so indicate, which of the plurality of possible reference frequencies is present, and for configuring the multiple for the periodic output signal accordingly.

22. The integrated circuit as recited in claim 21 wherein the frequency reference signal is provided by an externally generated reference clock signal.

23. The integrated circuit as recited in claim 21 wherein the frequency reference signal is provided by a resonant circuit coupled to the integrated circuit.

24. The integrated circuit as recited in claim 21 wherein the circuit means comprises:
phase locked loop circuit means having a capture range, when expressed as a percentage of its nominal free-running frequency, which is less than the proportion by which the possible reference frequencies that are closest in frequency differ.

25. The integrated circuit as recited in claim 24 wherein the circuit means comprises:
first means for generating a first signal related to the externally provided frequency reference signal;
second means for generating a second signal related to the output signal of the signal generation circuit;
third means for determining the number of cycles of one of the first or second signals which occur during a portion of the period of the other of the first or second signals.

26. An integrated circuit comprising:
a phase locked loop circuit having an input for receiving an externally provided reference clock signal having a frequency substantially equal to any of at least two possible reference frequencies, and for generating a VCO output signal having a nominal frequency related to that of the reference clock signal; and
a frequency detection circuit for determining, absent any additional externally provided signal to so indicate, which of the at least two possible reference clock frequencies is present, and for communicating an indication thereof to the phase locked loop circuit.

27. The integrated circuit device as recited in claim 26 wherein the frequency detection circuit comprises:
a second phase locked loop circuit having a capture range, when expressed as a percentage of its nominal free-running frequency, which is less than the proportion by which the possible reference frequencies that are closest in frequency differ.

28. The integrated circuit device as recited in claim 26 wherein:
at least one of the possible reference clock frequencies corresponds to a normal operating mode of the device; and
at least one of the possible reference clock frequencies corresponds to a test mode of the device.

29. In an integrated circuit responsive to an externally provided frequency reference signal having a frequency substantially equal to any of at least two possible reference frequencies, said integrated circuit requiring a different internal configuration depending upon which reference frequency is provided, a method of eliminating at least one external pin otherwise required to convey to the integrated circuit an external signal for indicating which reference frequency is provided, said method comprising the steps of:
generating on the integrated circuit a first signal having a frequency within a predetermined range;
comparing the externally provided frequency reference signal to the first signal, to determine which reference frequency is provided;
generating at least one control signal as a result of the comparing step to indicate which reference frequency is provided; and
configuring the integrated circuit in accordance with the at least one control signal.

30. The method as recited in claim 29 wherein the comparing step comprises the steps of:
generating a second signal having a nominal frequency which is a selectable fraction of the first signal;
stepping through each selectable fraction and comparing the resulting second signal to a third signal related to the frequency reference signal, until a selected fraction is found that generates a nominal frequency of the second signal which is within a chosen tolerance of the frequency of the third signal; and then
inferring the frequency of the frequency reference signal in accordance with the selected fraction, the relationship of the third signal to the frequency reference signal, and the nominal frequency of the first signal.

31. The method as recited in claim 29 wherein the comparing step comprises the steps of:
a second signal having a nominal frequency which is a selectable fraction of the frequency reference signal;
stepping through each selectable fraction and comparing the resulting second signal to a third signal related to the first signal, until a selected fraction is found that generates a nominal frequency of the second internal signal which is within a chosen tolerance of the frequency of the third signal; and then inferring the frequency of the frequency reference signal in accordance with the selected fraction, the relationship of the third signal to the first signal, and the nominal frequency of the first signal.

32. In an integrated circuit responsive to an externally provided frequency reference signal having a frequency substantially equal to any of at least two possible reference frequencies, a method of determining which reference frequency is provided comprising of:

generating on the integrated circuit a first signal having a nominal frequency within a predetermined range;

comparing each of a plurality of signals having a respective frequency related to the externally provided frequency reference signal to the first signal, to determine which of the plurality of signals most closely matches the frequency of the first signal;

inferring the frequency of the frequency reference signal in accordance with relationship between the signal that most closely matches the frequency of the first signal and the externally provided frequency reference signal, and the nominal frequency of the first signal.

33. In a system including an integrated circuit responsive to an externally provided frequency reference signal, said integrated circuit having at least two possible modes of operation, a method of communicating a selected mode of operation to the integrated circuit, said method comprising the steps of:

providing to the integrated circuit an external frequency reference signal with a frequency substantially equal to a first reference frequency to select a first mode of operation; and providing to the integrated circuit an external frequency reference signal with a frequency substantially equal to a second reference frequency to select a second mode of operation.

34. The method as recited in claim 33 wherein:

the first mode of operation is a normal operating mode; and the second mode of operation is a test mode.

35. The method as recited in claim 33 wherein:

the first and second modes of operation are both normal operating modes.

36. An integrated circuit for recovering separate clock and data signals from an incoming bit-serial clock-encoded data input stream comprising:

a phase locked loop circuit responsive to the incoming bit-serial clock-encoded data input stream and further responsive to an externally provided frequency reference signal having a frequency substantially equal to any of a plurality of possible reference frequencies, said phase locked loop circuit including a voltage controlled oscillator (VCO) circuit for generating a VCO output clock signal having a nominal frequency that is a configurable multiple of the frequency of the externally provided frequency reference signal; and a frequency detection circuit for determining, absent any additional externally provided signal to so indicate, which of the plurality of possible reference frequencies is present, and for configuring the multiple for the VCO output clock signal accordingly.

37. The integrated circuit as recited in claim 36 wherein the bit-serial clock-encoded data input stream comprises a SONET data stream.

38. The integrated circuit as recited in claim 36 wherein the frequency reference signal is provided by an externally generated reference clock signal.

39. The integrated circuit as recited in claim 36 wherein the frequency reference signal is provided by a resonant circuit coupled to the integrated circuit.

40. The integrated circuit as recited in claim 36 wherein:

the multiple by which the nominal frequency of the VCO output clock signal relates to the frequency of the externally provided reference frequency signal is different for at least two of the possible reference frequencies of the externally provided frequency reference signal; and the nominal frequency of the VCO output clock signal is substantially identical for at least two of the possible reference frequencies of the externally provided frequency reference signal.

41. The integrated circuit as recited in claim 36 wherein:

at least one of the possible reference frequencies of the externally provided frequency reference signal corresponds to a normal operating mode of the integrated circuit; and at least one of the possible reference frequencies of the externally provided frequency reference signal corresponds to a test mode of the integrated circuit.

42. The integrated circuit as recited in claim 41 wherein:

at least two of the possible reference frequencies of the externally provided frequency reference signal each corresponds to a respective normal operating mode of the integrated circuit; and at least two of the possible reference frequencies of the externally provided frequency reference signal each corresponds to a respective test mode of the integrated circuit.

43. The integrated circuit as recited in claim 36 wherein each of the possible reference frequencies is chosen from a group of frequencies in which each respective frequency of the group relates to its next lower frequency of the group, if such exists, and its next higher frequency of the group, if such exists, by a fixed proportion.

44. The integrated circuit as recited in claim 43 wherein the fixed proportion comprises a factor of 2.

45. The integrated circuit as recited in claim 36 wherein the possible reference frequencies include approximately 155.52 MHz, approximately 77.76 MHz, and approximately 19.44 MHz.

46. The integrated circuit as recited in claim 43 wherein the possible reference frequencies further include approximately 38.88 MHz, approximately 9.72 MHz, and approximately 4.86 MHz.

47. The integrated circuit as recited in claim 46 wherein the possible reference frequencies of approximately 38.88 MHz, approximately 9.72 MHz, and approximately 4.86 MHz each correspond to a respective test mode of the integrated circuit.

* * * * *

UNITED STATES PATENT AND TRADEMARK OFFICE
CERTIFICATE OF CORRECTION

PATENT NO. : 6,686,803 B1
DATED : February 3, 2004
INVENTOR(S) : Perrott et al.

It is certified that error appears in the above-identified patent and that said Letters Patent is hereby corrected as shown below:

Column 9,
Line 44, "An eternally-provided" should read -- An externally-provided --

Column 14,
Line 64, "a second signal" should read -- generating a second signal --

Column 15,
Line 13, "comprising of" should read -- comprising the steps of --

Signed and Sealed this

Fifteenth Day of June, 2004

JON W. DUDAS
*Acting Director of the United States Patent and Trademark Office*